(12) United States Patent
Asada

(10) Patent No.: US 6,680,989 B1
(45) Date of Patent: Jan. 20, 2004

(54) METHOD AND APPARATUS FOR CLOCK SWITCHING

(75) Inventor: Takeshi Asada, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 09/430,443

(22) Filed: Oct. 29, 1999

(30) Foreign Application Priority Data

Oct. 30, 1998 (JP) .......................................... 10-310637

(51) Int. Cl.[7] .............................. H04L 7/00; H03D 3/24
(52) U.S. Cl. ...................................... 375/371; 375/375
(58) Field of Search ................................. 375/371, 373, 375/375, 376, 357; 327/2, 3, 144, 146, 147, 151, 152, 158; 370/517, 518; 331/1 A (56) References Cited

U.S. PATENT DOCUMENTS

| | | | |
|---|---|---|---|
| 5,455,840 A | * | 10/1995 | Nakauchi et al. ............ 375/371 |
| 5,528,198 A | * | 6/1996 | Baba et al. .................. 331/1 A |
| 5,920,600 A | * | 7/1999 | Yamaoka et al. ............ 375/376 |
| 6,044,122 A | * | 3/2000 | Ellersick et al. ............. 375/360 |

FOREIGN PATENT DOCUMENTS

| | | |
|---|---|---|
| JP | 57-57327 | 4/1982 |
| JP | 08097750 | 4/1996 |

* cited by examiner

*Primary Examiner*—Don N. Vo
(74) *Attorney, Agent, or Firm*—Katten Muchin Zavis Rosenman (57) ABSTRACT

Recapture time and frequency disturbance behavior at the time of switching a transmission line extracted clock from an active clock to a standby clock are improved for a PLL circuit which is placed after a clock selection circuit. Phase difference is detected between a reference clock generated by the PLL circuit from a selected clock and a clock extracted from a standby transmission line and, based on the detected phase difference, the phase of the standby clock to be supplied to the clock selection circuit is adjusted and brought close to the phase of the reference clock. The clock phase adjustment is accomplished by generating a plurality of clocks with different phases using a delay element, and by selecting one of them in accordance with the detected phase difference.

14 Claims, 12 Drawing Sheets

METHOD AND APPARATUS FOR CLOCK SWITCHING

BACKGROUND OF THE INVENTION

1. Field of the Invention

The present invention relates to a method and apparatus for clock switching, and more particularly to a method and apparatus for switching a clock extracted from a transmission line signal in a digital transmission apparatus or a digital exchange.

2. Description of the Related Art

Remote transmission apparatuses, unlike transmission apparatuses installed within a central office, are often located in areas where there are no apparatuses nearby that supply reference clocks. To address this, a method has been developed that creates a reference clock from the clock extracted from a transmission line signal (transmission line extracted clock) received from a distant location.

In this type of remote transmission apparatus, the reference clock for use within the apparatus is created by selecting one of transmission line reference clocks received from two transmission lines, line 0 and line 1, and by supplying the selected clock to a PLL circuit. However, the PLL is sensitive to the switching of the input source and, depending on the phase difference between the two clocks, an unexpected situation, such as the generation of an erroneous alarm, may occur. Usually, such a problem is addressed, for example, by varying a PLL circuit constant (lock capture time).

However, while the problem can be addressed to a certain extent by varying the PLL circuit constant, it is often difficult to improve the characteristics of the PLL circuit for the following reasons.

Both the recapture time and frequency disturbance characteristics cannot be improved at the same time; therefore, one or the other of the characteristics must be sacrificed.

If the input frequency to the PLL circuit is extremely low, it takes a long time before the PLL can acquire lock and then settle.

SUMMARY OF THE INVENTION

The present invention has been devised in view of the above situation, and it is an object of the invention to provide a clock switching system that can suppress clock disturbances when a standby clock is switched to an active clock.

According to the present invention, there is provided a clock switching method comprising the steps of: selecting one of a plurality of clocks and generating a reference clock from the selected clock; detecting a phase difference between the clock before the selection and the reference clock; and changing the phase of a non-selected clock based on the detected phase difference so that a phase difference from the selected clock is reduced, and thereby suppressing clock disturbances when the clock selection is switched.

According to the present invention, there is also provided a clock switching apparatus comprising: a clock selection and reference clock generation circuit for selecting one of a plurality of clocks, and for generating a reference clock from the selected clock; a phase difference detector for detecting a phase difference between the clock before the selection and the reference clock; and a phase changing section for changing the phase of a non-selected clock based on the detected phase difference so that a phase difference from the selected clock is reduced, and thereby suppressing clock disturbances when the clock selection is switched.

DESCRIPTION OF THE PREFERRED EMBODIMENTS

Embodiments of the present invention will be described below with reference to the accompanying drawings.

Figure 1:
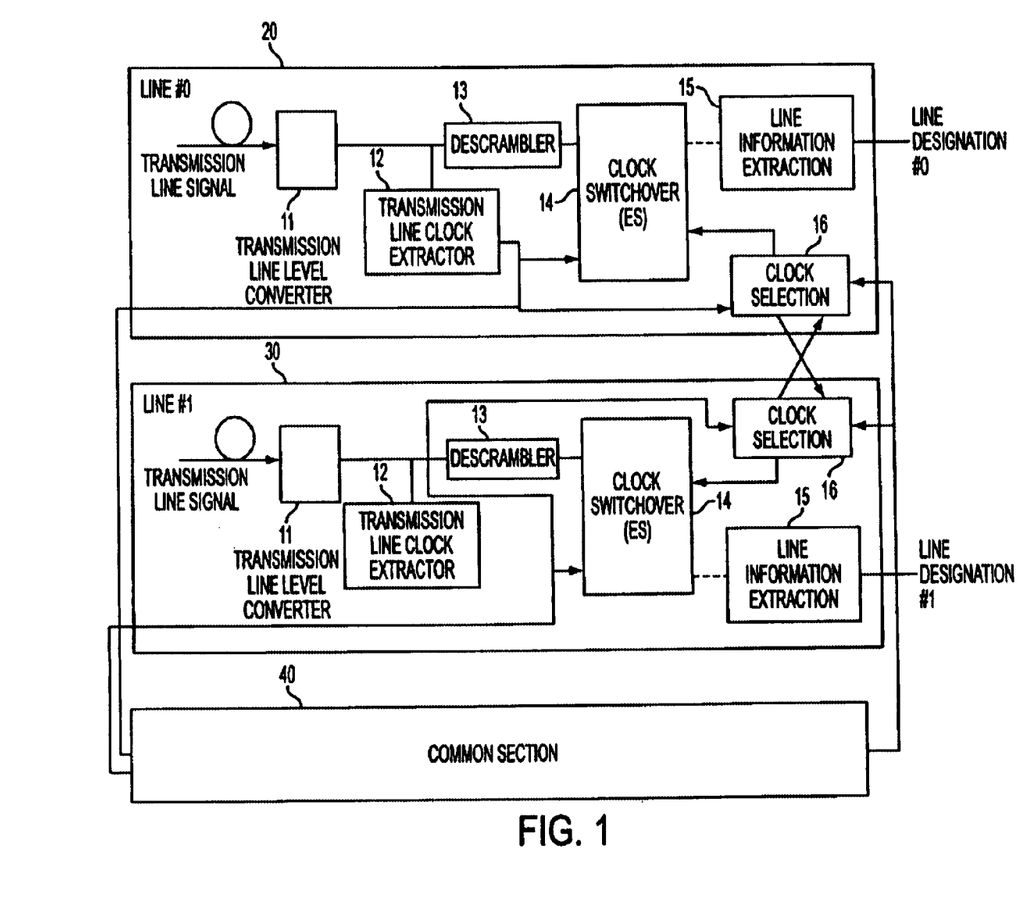
FIG. 1 is a block diagram showing one embodiment of the present invention.

FIG. 1 is a block diagram showing one example of a remote transmission apparatus according to one embodiment of the present invention. In the figure, reference numeral 20 is a line-0 apparatus, 30 is a line-1 apparatus, and 40 is a common section. The line-0 apparatus and line-1 apparatus are both data transmission apparatuses, and the common section 40 is an apparatus that obtains a system reference clock by selecting either the clock extracted by the line-0 apparatus or the clock extracted by the line-1 apparatus.

In the line-0 apparatus 20, reference numeral 11 is a transmission line level converter which, for example, receives a transmission line signal from a transmission line and converts the transmission line level. When the transmission line signal is an optical signal from an optical transmission line, the converter 11 contains an optical-to-electrical converter. Reference numeral 12 is a transmission line clock extractor which receives the output of the transmission line level converter 11 and extracts a clock contained in the transmission line.

Reference numeral 13 is a descrambler which receives the output of the transmission level converter 11 and recovers the transmission line data by decoding the data scrambled at the transmitting end not shown, 14 is a switchover section which receives the output of the descrambler 13 and where the timing reference for the transmission line data is switched from the transmission line clock to the system internal clock, and 15 is a line information extraction circuit which extracts line information from the transmission line data and outputs line designation signal (#0). Reference numeral 16 is a clock selector which selects either the output of the transmission line clock extractor 12 or the clock from the other line or the system reference clock and supplies the selected clock to the switchover section 14, etc. as the clock for the line-0 apparatus. The switchover section 14 contains a FIFO (ES: Elastic Store).

Exactly the same configuration applies for the line-1 apparatus, and therefore, the description will not be repeated.

The common section 40, based on the line designation signal #0 from the line-0 apparatus 20 and the line designation signal #1 from the line-1 apparatus 30, selects the clock extracted by the transmission line clock extractor 12 in the line-0 apparatus 20 or the clock extracted by the transmission line clock extractor 12 in the line-1 apparatus 30, and generates the system reference clock from the selected clock.

The clock selectors 16 in the line-0 apparatus 20 and line-1 apparatus 30 select one of the three clocks, i.e., the clock selected by the common section 40, the clock extracted in the line-0 apparatus 20, or the clock extracted in the line-1 apparatus 30, and use the selected clock as the reference clock for the respective apparatuses.

The following description deals with an example in which the present invention is applied to the clock switching in the common section 40 but, as will be described later, the invention can likewise be applied to the clock switching in the clock selectors 16 in the line-0 apparatus 20 and line-1 apparatus 30.

Figure 2:
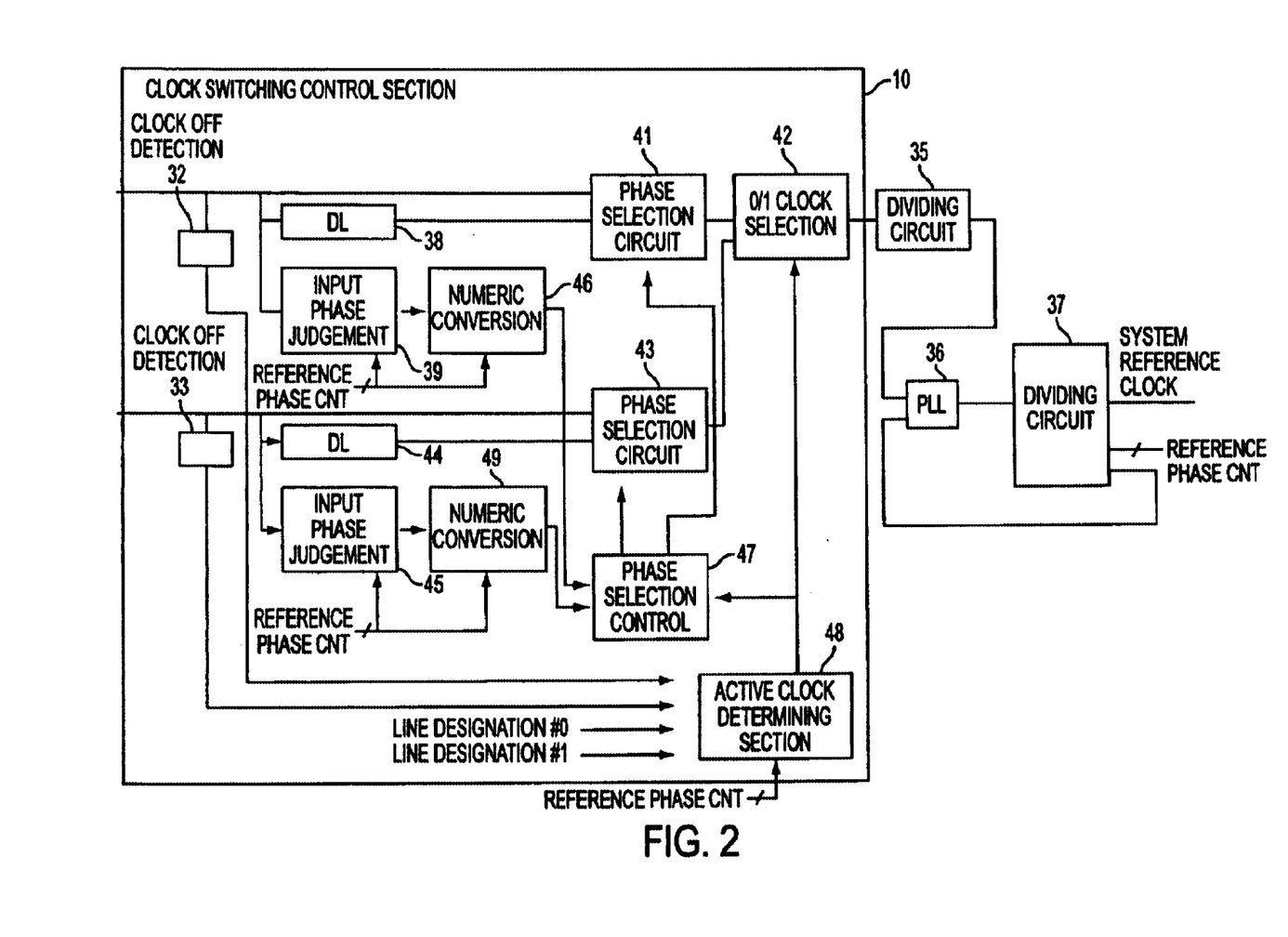
FIG. 2 is a block diagram showing the detailed configuration of a common section 40.

FIG. 2 shows the detailed configuration of the common section 40. In FIG. 2, reference numeral 32 is a clock OFF detector for detecting a clock OFF condition on the transmission line 0, and 33 is a clock OFF detector for detecting a clock OFF condition on the transmission line 1; the outputs of these detectors are fed to an active clock determining section 48.

Reference numeral 38 is a delay line for delaying the clock extracted from the transmission line 0, 39 is an input phase judging section which receives the extracted clock and outputs a pulse whose width represents the phase difference between the input clock and the reference clock, and 46 is a numeric conversion section which converts the phase into a numeric form by counting the clocks during the pulse having a width corresponding to the phase difference output from the input phase judging section 39. Reference numeral 41 is a phase selection circuit which receives the input clock and the clock passed through the delay line 38, and selects the clock having the smaller phase difference relative to the reference clock when the line-0 side is providing a standby clock.

The same configuration applies for the line 1 side. That is, for the line 1 side, a delay line 44, an input phase judging section 45, a numeric conversion section 49, and a phase selection circuit 43 are arranged in the same configuration as above. Reference numeral 47 is a phase selection control section which receives the output of the line-0 numeric conversion section 46 or the line-1 numeric conversion section 49, and controls the line-0 phase selection circuit 41 or the line-1 phase selection circuit 43 in such a manner that the phase of the input clock on the line set as the standby clock line is brought close to the phase of the reference clock. The active clock determining section 48 receives the outputs of the clock OFF detectors 32 and 33 as well as the line designation signals #0 and #1, and determines which of the lines 0 and 1 is to be set as the line to provide the active clock. When the clock OFF condition is not detected on either line, the active clock determining section 48 determines the active clock line in accordance with the line designation signals #0 and #1, and when the clock OFF condition is detected on either one of the lines, the active clock determining section 48 determines the other line as the active clock line, irrespective of the line designation signals. Reference numeral 42 is a line 0/1 clock selector for selecting one or the other of the outputs of the phase selection circuits 41 and 43 in accordance with the control output of the active clock determining section 48. The output of the active clock determining section 48 is also supplied to the phase selection control section 47.

Reference numeral 35 is a frequency dividing circuit for frequency dividing the output of the line 0/1 clock selector 42, 36 is a PLL circuit for multiplying the output frequency of the frequency dividing circuit, and 37 is a frequency dividing circuit which outputs signals with various division ratios by dividing the multiplied output supplied from the PLL circuit 36; one of these output signals is fed back to a phase comparison input of the PLL circuit 36. The frequency dividing circuit 37 outputs the system reference clock and a reference phase count (cnt) signal. The reference phase count signal is made up of a plurality of signals whose binary values represent the phase of the reference signal. The operation of the thus configured circuit will be described below.

Figure 3:
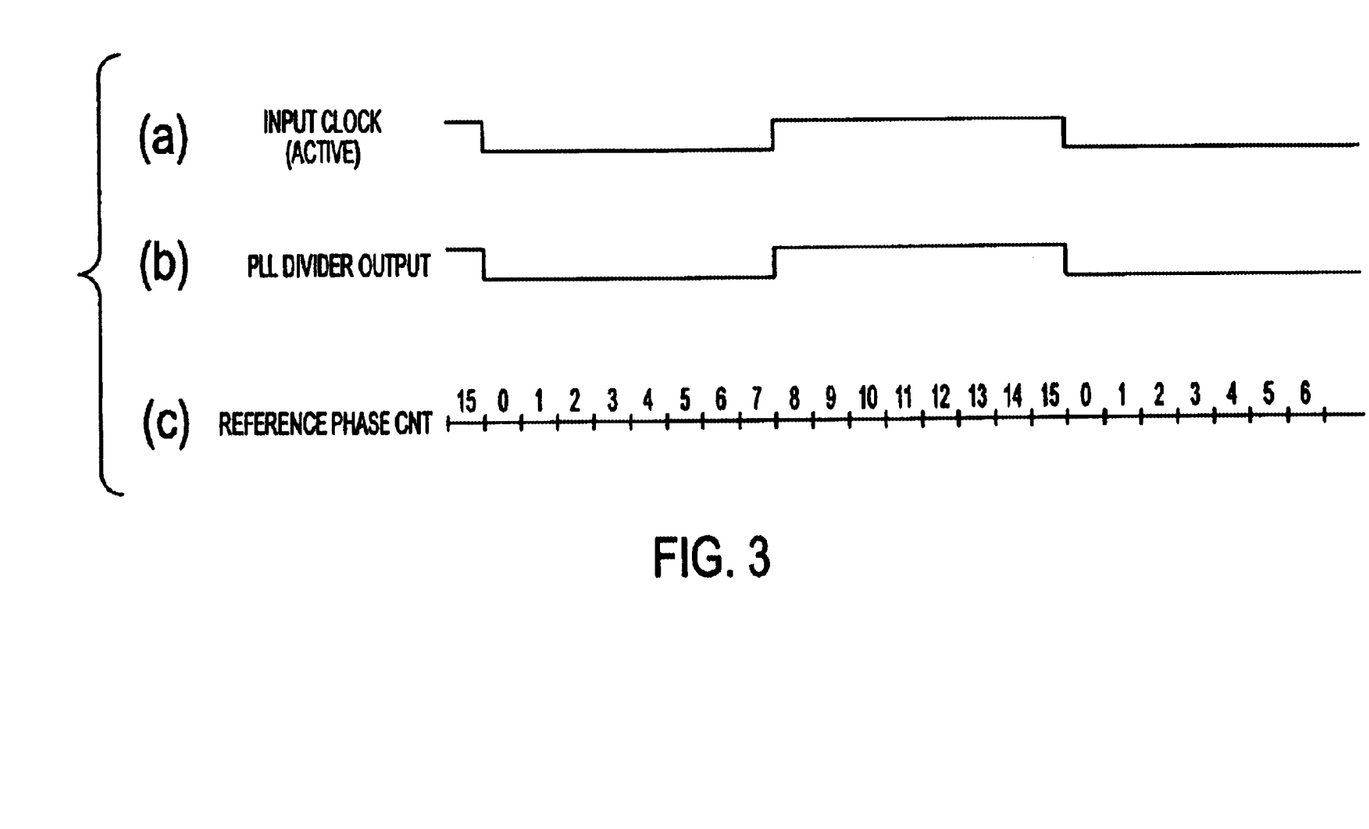
FIG. 3 is a timing chart showing the phase relationship between an active input clock and a reference phase.
Figure 5:
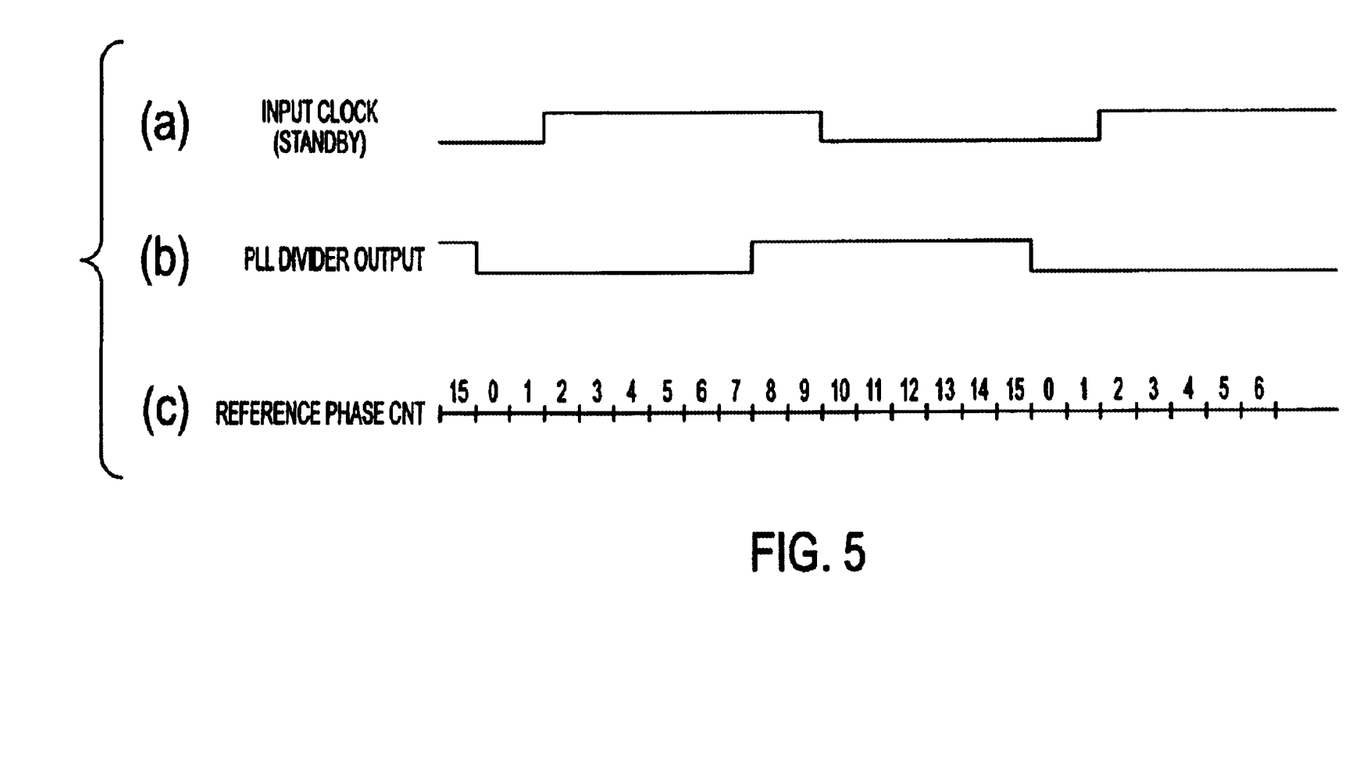
FIG. 5 is a timing chart showing the phase relationship between a standby input clock and the reference phase.

FIGS. 3 and 5 show examples of the input clock (a), the highest-order part of the reference phase count signal (b), and the reference phase count for the active and standby clock lines, respectively. In the illustrated example, the reference phase count output from the frequency dividing circuit 37 is made up of five signals, and the period of the highest-order signal (b) (with the greatest division ratio) is equal to the period of the input clock (a). Numeric values 0 to 15 represented by the high-order four bits (four signals in decreasing order of division ratio) of the five signals will be referred to as the reference phase count (c) representing the phase of the reference signal. The lowest-order signal (with the smallest division ratio) is used for phase difference counting, as will be described later.

As shown in FIG. 3, the input clock (a) on the line selected as the active clock line is, as a matter of course, synchronized to the reference clock (b)(c). On the other hand, as shown in FIG. 5, the input clock (a) on the standby clock line maintains a constant phase difference relative to the reference clock (b)(c) since the period of the input clock (a) is equal to the period of the reference clock.

Figure 4:
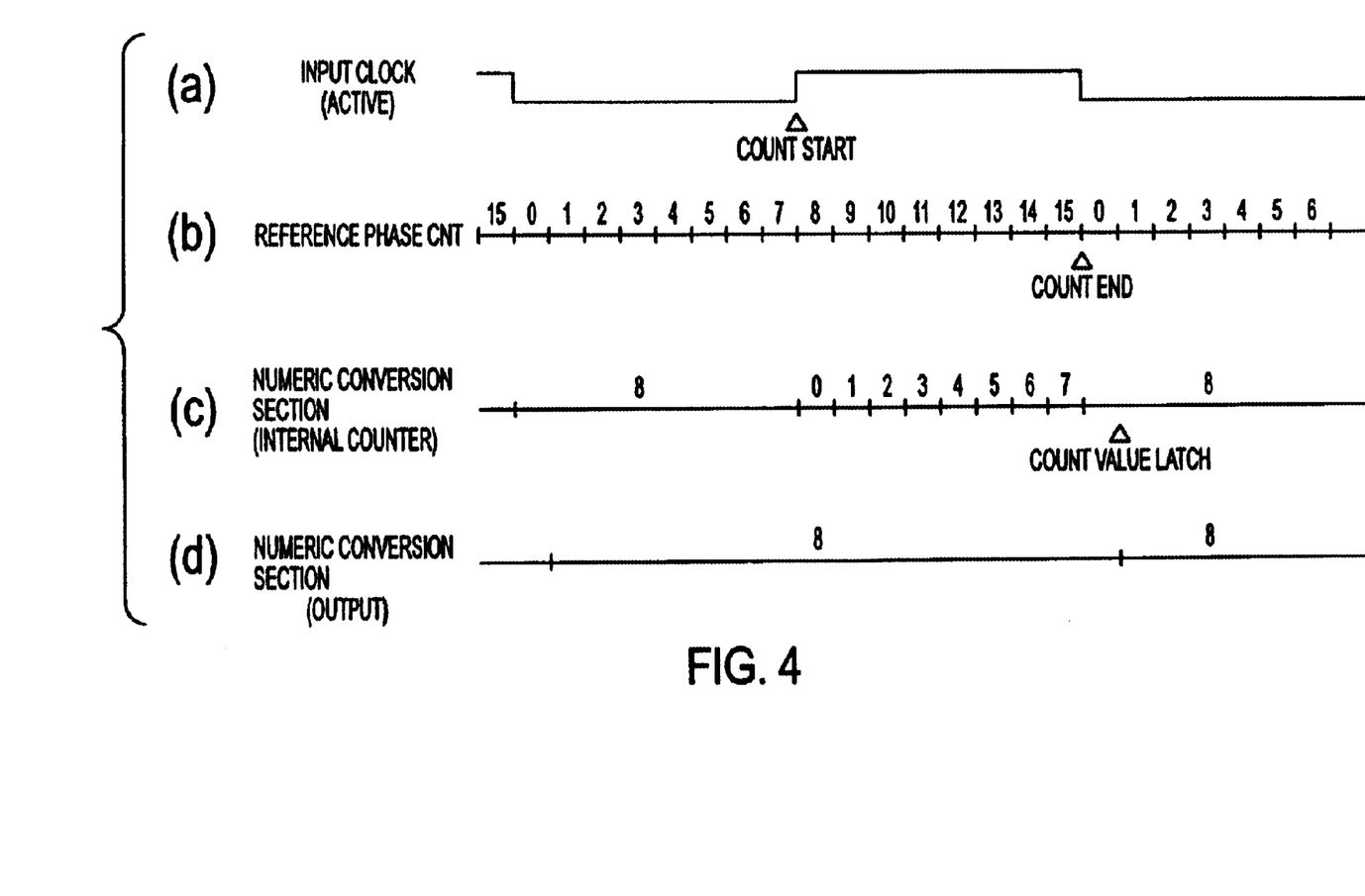
FIG. 4 is a timing chart for explaining the detection of a phase difference for the active input clock.
Figure 6:
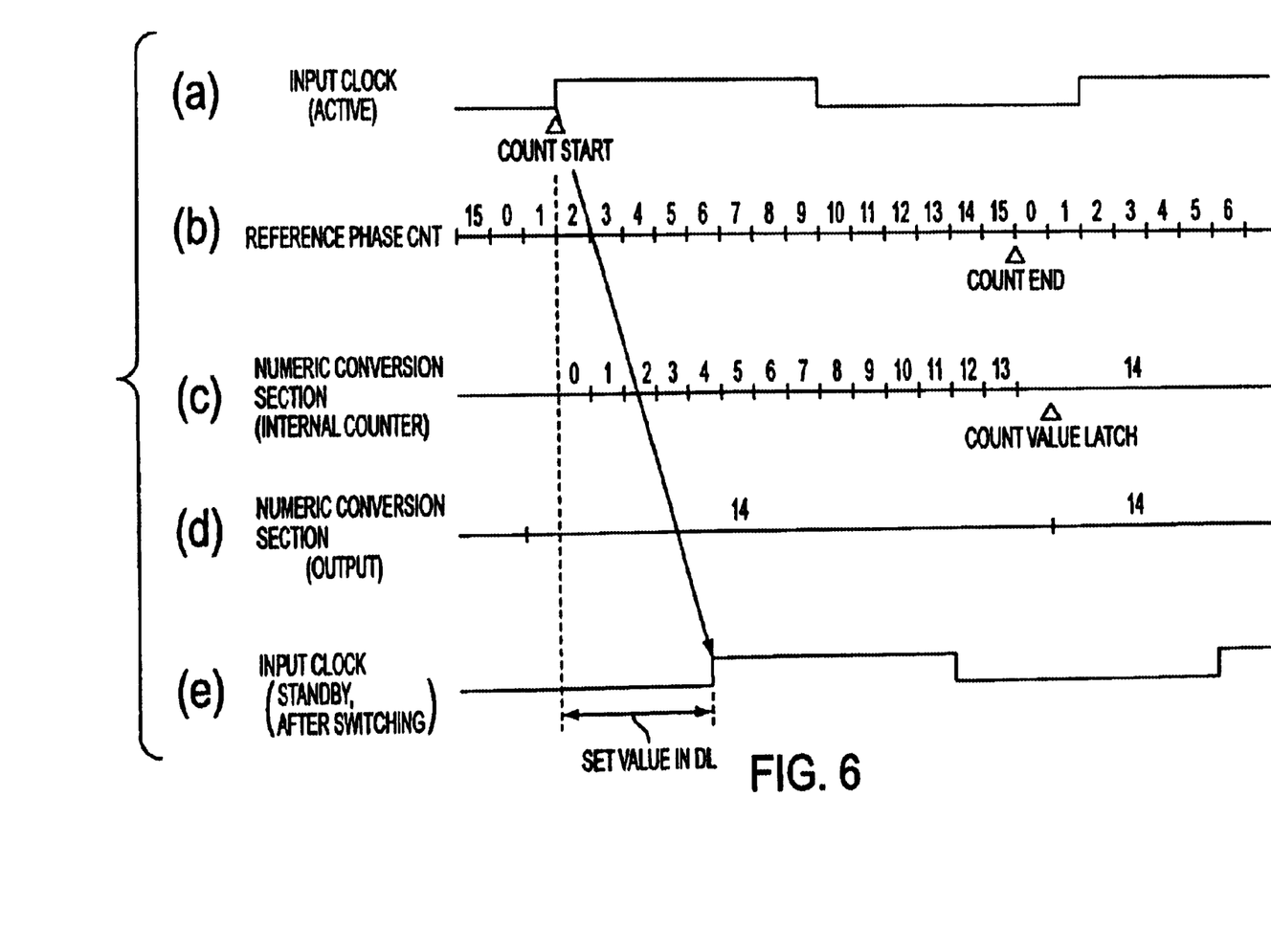
FIG. 6 is a timing chart for explaining the detection of a phase difference for the standby input clock.

FIGS. 4 and 6 show the operation of the input phase judging sections 39 and 45 and numeric conversion sections 46 and 49 in the active and standby clock line sides, respectively. The input phase judging sections 39 and 45 are each constructed, for example, from a flip-flop which is set by the rising edge of the input clock and reset by the falling edge of the highest-order part of the reference phase count signal, that is, when the reference phase count changes from 15 to 0. The numeric conversion sections 46 and 49 count the lowest-order part of the reference count signal during the period when the flip-flop of the input phase judging section 39 or 45 is set, and latch the count result for output.

As shown in FIG. 4, in the active clock line side, since the input clock (a) is synchronized to the reference phase count (b), the counting (c) is started at or near the midpoint value 8 of the reference phase count, and the output (d) of the numeric conversion section is about 7 to 8.

As shown in FIG. 6, in the standby clock line side, since the input clock (a) is not synchronized to the reference phase count (b), the counting (c) is started at various values of the reference phase count, so that the output (d) of the numeric conversion section can take values ranging from 0 to 15. In the illustrated example, since the input clock is advanced in phase with respect to the reference clock, the counting is started earlier than the midpoint value 8 of the reference phase count, and the output of the numeric conversion section takes a value of "14" which is larger than 8.

Turning back to FIG. 2, the phase selection control section 47 receives the active line information from the active clock determining section 48 to know which line is providing the standby clock, and performs control only on the phase selection circuit 43 in the standby clock line side. More specifically, when the value received from the numeric conversion section 49 is larger than the midpoint value of the reference phase count by a value equal to or larger than a predetermined value, an instruction is issued to switch to the clock passed through the delay line 44. If the delay line 44 is configured to be able to provide more than one selection, the amount of delay can be selected according to the amount of difference from the midpoint value. In this way, the phase of the standby clock supplied to the line 0/1 clock selector 42 can be brought closer to the phase of the active clock.

As shown in FIG. 6, if the input clock is advanced in phase with respect to the reference clock, and the output of the numeric conversion section is 14, the phase selection circuit 43 selects the input clock delayed through the delay line 44. As a result, the phase of the input clock on the standby clock line moves closer to the phase of the active clock. Under this phase relationship, switching is made between the active and standby clocks.

With the above operation, the phase of the standby clock can be brought closer to the phase of the active clock. When switching of the active clock occurs in this condition (regardless of whether the switching is performed by maintenance personnel or automatically initiated due to a clock OFF detection), a clock phase jump can be suppressed to a minimum. Further, by increasing the number of delay lines and selection circuits as necessary, the phase difference relative to the active clock can be brought infinitely close to zero.

According to the above embodiment, since a proper phase relationship is constantly maintained between the active and standby clocks, the recapture time of the PLL at the time of clock switching can be held to a small value. When the phase variation of the input to the PLL at the time of clock switching is small, the recapture time and the frequency disturbance can both be held minimum. Furthermore, even when the input frequency is extremely low, the PLL quickly settles.

Figure 7:
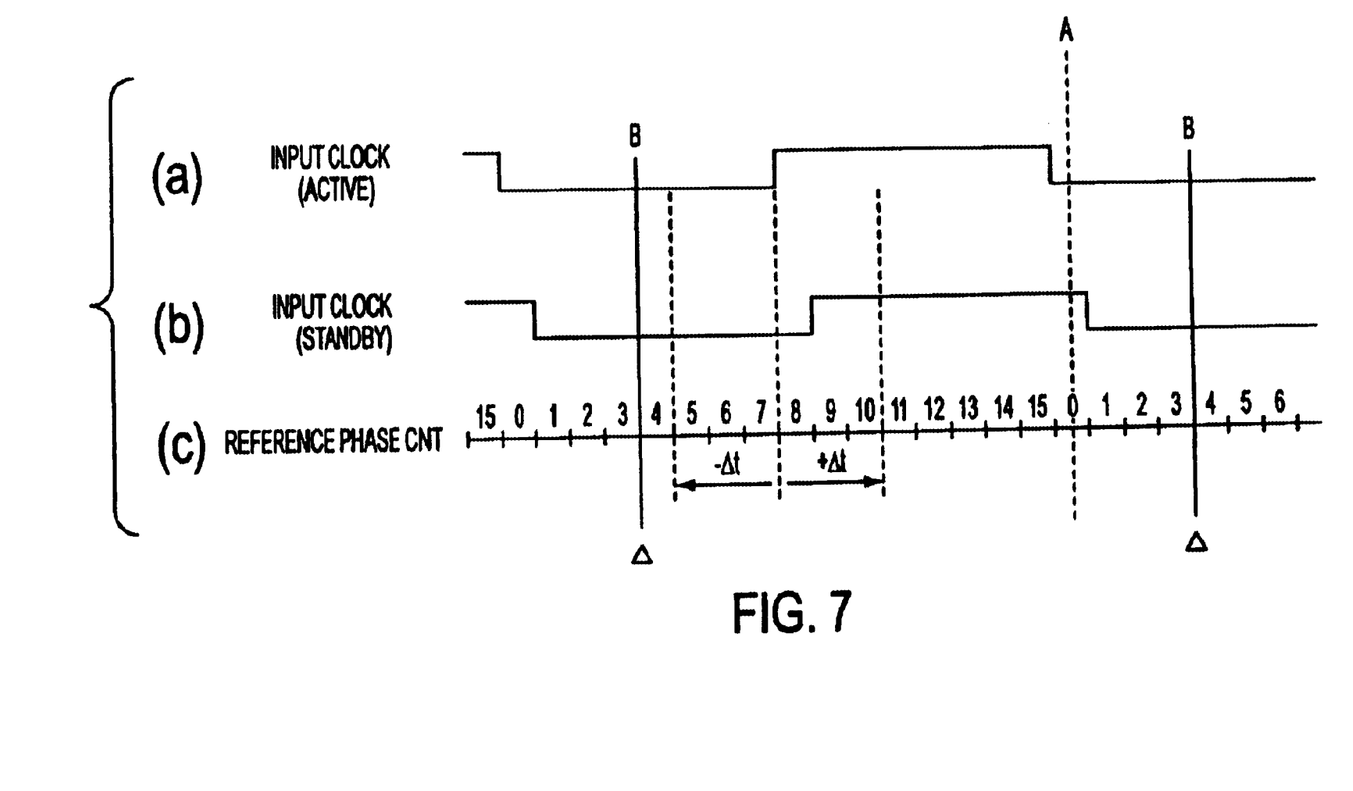
FIG. 7 is a timing chart showing the timing for clock switching.

Even if the phase of the standby clock can be brought close to the phase of the active clock, as described above, it is difficult to make both clocks completely match in phase. As a result, if switching is made to the standby clock at timing "A" shown in FIG. 7, a so-called "spike" will occur on the clock after selection or, if the phase relationship between the active and standby clocks is opposite from that shown in FIG. 7, a so-called "pulse dropout" will occur. In view of this, if switching to the standby clock is made at fixed timing "B" shown in FIG. 7, while holding the phase difference of the standby clock within ±Δt (Δt is ¼ or less of the clock period) in the manner described above, spikes and dropouts can be prevented from occurring at the time of clock switching. To achieve this, the reference phase count value is supplied to the active clock determining section 48 (FIG. 2) which, based thereon, controls the line 0/1 clock selector 42. In this way, the disturbance and settling time problems at the time of clock switching, the inherent problems of the PLL, can be completely avoided.

Figure 8:
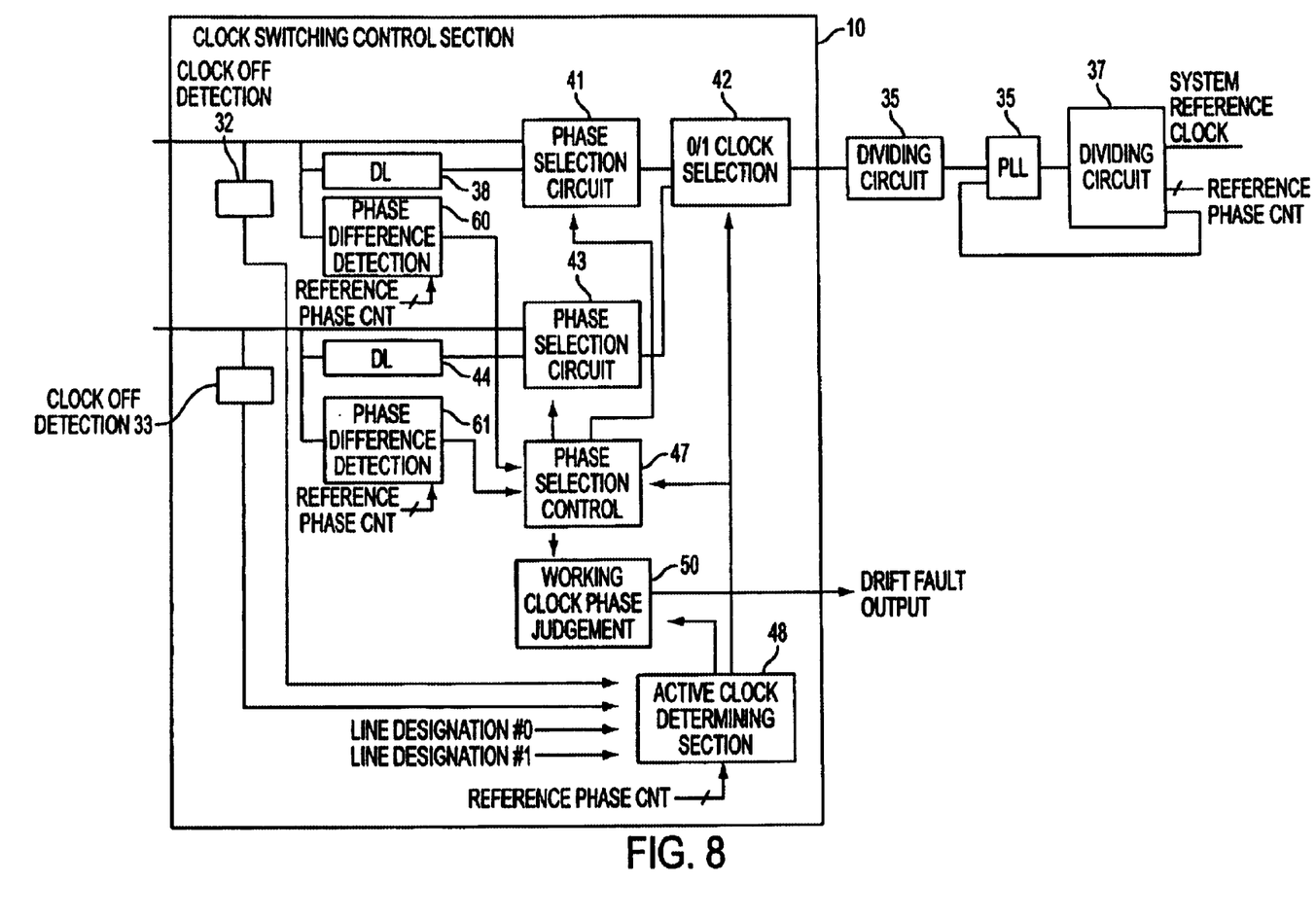
FIG. 8 is a block diagram showing a first modification of the circuit of FIG. 2.

In the circuit shown in FIG. 8, an active clock phase judging section 50 is added to the circuit shown in FIG. 2. In FIG. 8 and later figures, the input phase judging section 39 and numeric conversion section 46 in FIG. 2 are shown as a single input phase difference detector 60, and likewise, the input phase judging section 45 and numeric conversion section 49 in FIG. 2 are shown as a single input phase difference detector 61.

As explained with reference to FIG. 4, when the active clock is operating properly, its associated input phase judging section outputs the midpoint value of the reference phase count. When the value output from the input phase judging section in the active clock line side goes outside the tolerance range centered about the midpoint value of the reference phase count, the active clock phase judging section 50 judges the condition as being a drift fault and issues an alarm. Such a drift fault occurs because of a failure of the PLL or jitter or wander of the input clock.

Figure 9:
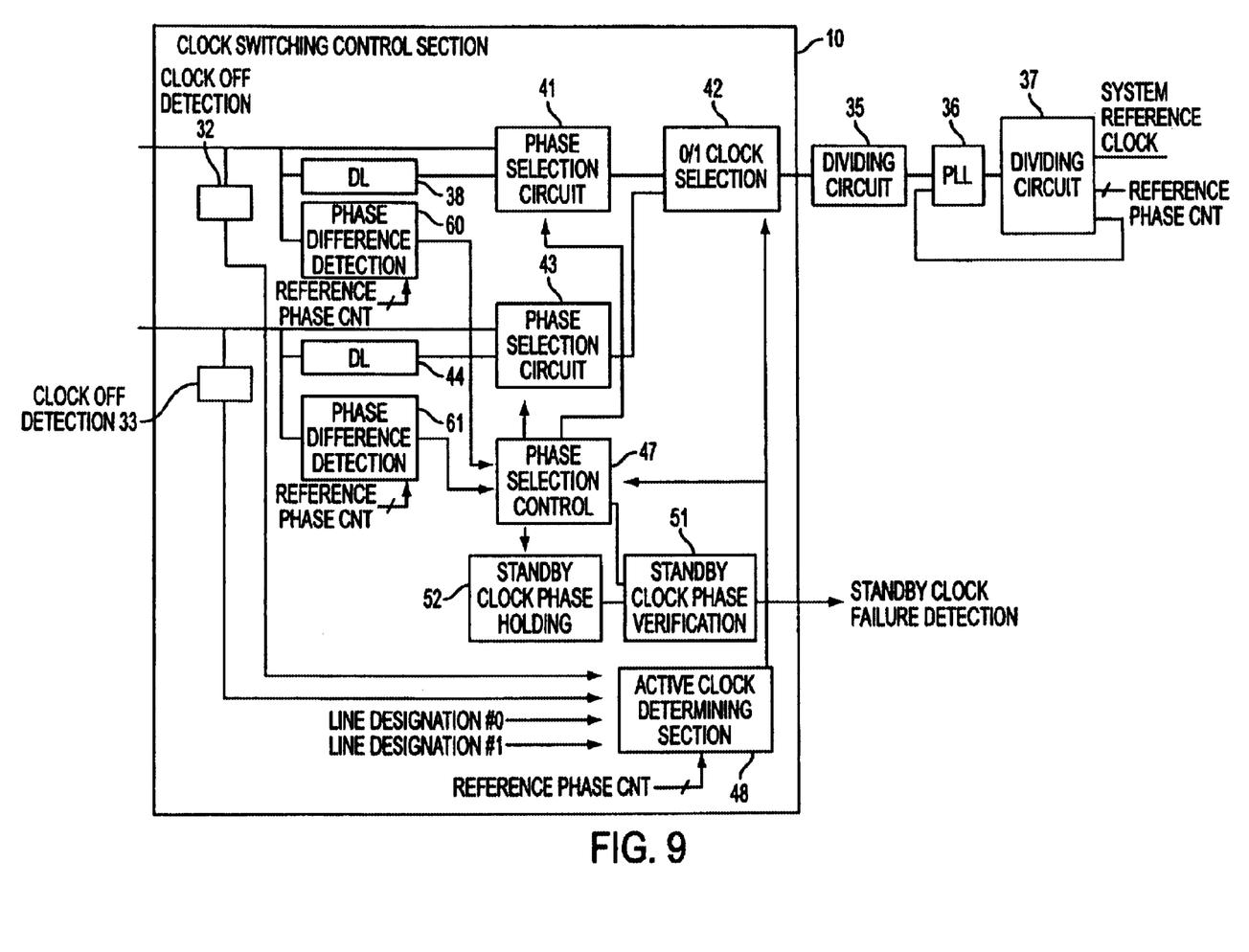
FIG. 9 is a block diagram showing a second modification of the circuit of FIG. 2.

In the circuit shown in FIG. 9, a standby clock phase holding section 52 and a standby clock phase verification section 51 are added to the circuit shown in FIG. 2.

As explained with reference to FIG. 6, when the standby clock is operating properly, its associated input phase judging section outputs a predetermined value. This value is held by the standby clock phase holding section 52. When the value output from the input phase judging section in the standby clock line side goes outside the tolerance range centered about the value held by the standby clock phase holding section 52, the standby clock phase verification section 51 judges the condition as being a drift fault and issues an alarm.

Figure 10:
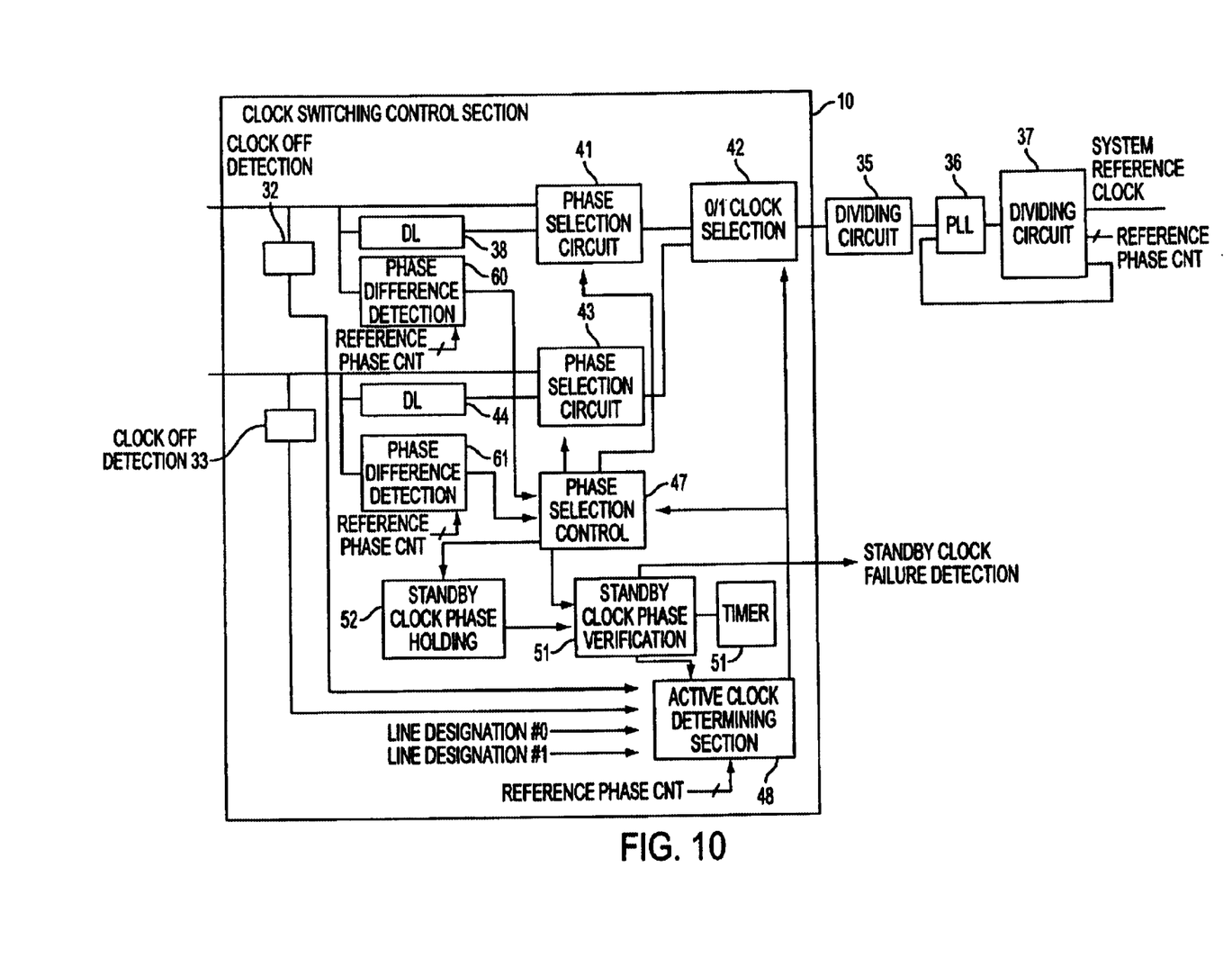
FIG. 10 is a block diagram showing a modification of the circuit of FIG. 9.

In the circuit shown in FIG. 10, a timer section 53 is added to the configuration shown in FIG. 9.

During the period when a standby clock fault is being output from the standby clock phase verification section 51, switching to the standby clock is prohibited, and after the standby clock fault has ceased to be output, switching to the standby clock is performed. However, there are cases where the alarm ceases only temporarily. Also, in general, immediately after the ceasing of the alarm, the clock phase is unstable. In such cases, to prevent trouble from occurring due to immediate switching to the standby clock, the timer section 53 counts the time that elapses from the moment that the alarm has ceased, and prohibits the clock switching for a predetermined period of time after the ceasing of the alarm.

The description so far given has dealt with examples in which the present invention is applied to the clock switching in the common section 40 of FIG. 1, but the present invention is also applicable to the clock switching in the clock selectors 16 in the line-0 apparatus 20 and line-1 apparatus 30.

Figure 11:
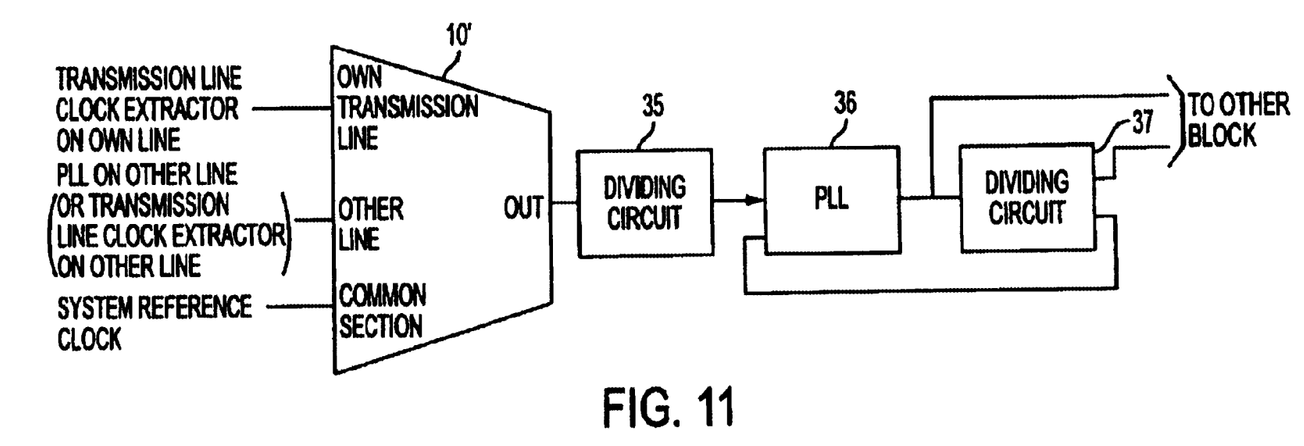
FIG. 11 is a block diagram showing a configuration where the present invention is applied to a clock selector 16 in FIG. 1.

FIG. 11 shows the configuration of the clock selector 16 in the latter case. Compared with the configuration of FIG. 2, the clock switching control section 10 of FIG. 2 is replaced by a clock switching control section 10'. While the clock switching control section 10 of FIG. 2 selects one of the two clock inputs as the active clock and the other as the standby clock, the clock switching control section 10' of FIG. 11 selects one of three clock inputs as the active clock and the remaining two as standby clocks. The only difference between the two configurations is the number of standby clocks, and therefore, a detailed description will not be given here.

Figure 12:
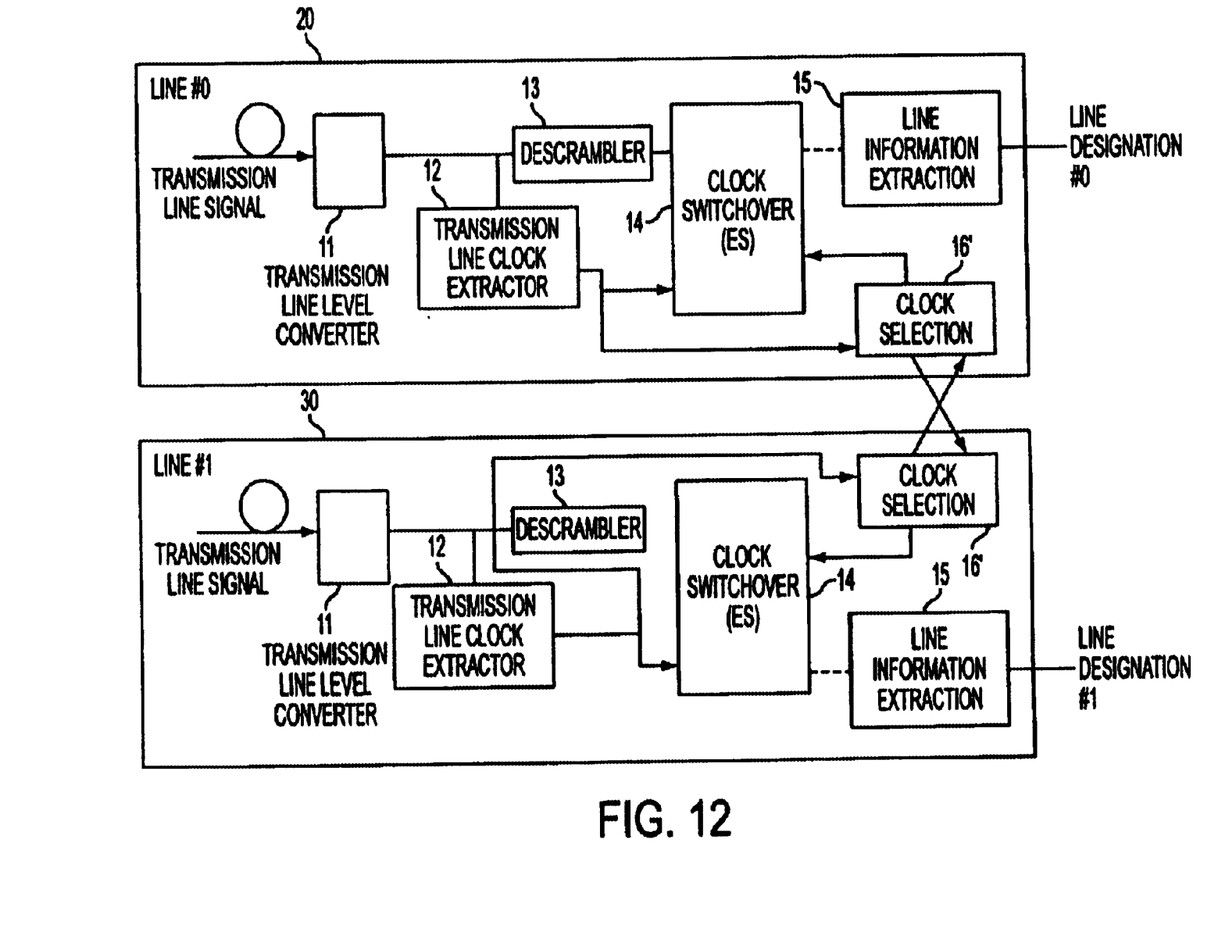
FIG. 12 is a block diagram showing another example of the entire apparatus configuration.

Besides the entire system configuration shown in FIG. 1, a configuration that dispenses with the common section 40, such as shown in FIG. 12, is also possible. In this case, the clock selectors 16' in the line-0 apparatus 20 and line-1 apparatus 30 each include the configuration shown in FIG. 2 which selects one of the two clock inputs as the active clock and the other as the standby clock.

What is claimed is:

1. A clock switching method comprising the steps of:

(a) selecting one of a plurality of clocks extracted from a plurality of transmission line signals and generating a reference clock from the selected clock;

(b) detecting a phase difference between a non-selected clock and the reference clock; and (c) changing the phase of the non-selected clock so that the detected phase difference from the selected clock is reduced, and thereby suppressing clock disturbances when the clock selection is switched.

2. A method according to claim 1, wherein the step (c) includes the substeps of:

(i) generating a plurality of clocks with different phases by delaying the non-selected clock; and (ii) selecting one of the plurality of clocks with different phases in accordance with the detected phase difference for the non-selected clock, and thereby changing the phase of the non-selected clock.

3. A method according to claim 1, wherein the step (b) includes the substeps of:

(i) generating a pulse whose width represents the phase difference between the non-selected clock and the reference clock; and (ii) converting the phase difference into a numeric form by counting clocks during the generated pulse.

4. A method according to claim 1, wherein the clock selection is switched at a fixed phase timing of the reference clock.

5. A method according to claim 1, further comprising the step of:

(d) outputting a signal indicative of a failure of an active clock when a detected phase difference for the selected clock exceeds a tolerance range.

6. A method according to claim 1, further comprising the steps of:

(d) holding the phase difference detected at the time of normal operation for the non-selected clock; and (e) outputting a signal indicative of a failure of a standby clock when, for the non-selected clock, a difference exceeding a tolerance range is detected between the detected phase difference and the phase difference being held.

7. A method according to claim 6, further comprising the step of prohibiting switching of the clock selection until a prescribed time elapses after the difference between the detected phase difference and the phase difference being held has been brought back into the tolerance range from outside the tolerance range in the step (e).

8. A clock switching apparatus comprising:

a clock selection and reference clock generation circuit for selecting one of a plurality of clocks extracted from a plurality of transmission line signals, and for generating a reference clock from the selected clock;

a phase difference detector for detecting a phase difference between a non-selected clock and the reference clock; and a phases changing section for changing the phase of the non-selected clock so that the detected phase difference is reduced, and thereby suppressing clock disturbances when the clock selection is switched.

9. An apparatus according to claim 8, wherein the phase changing section includes:

a delay element for generating a plurality of clocks with different phases by delaying the non-selected clock; and a phases selection circuit for selecting one of the plurality of clocks with different phases in accordance with the detected phase difference for the non-selected clock, and thereby changing the phase of the non-selected clock.

10. An apparatus according to claim 8, wherein the phase detector includes:

an input phase judging section for generating a pulse whose width represents the phase difference between the non-selected clock and the reference clock; and a numeric conversion section for converting the phased difference into a numeric form by counting clocks during the generated pulse.

11. An apparatus according to claim 8, wherein the clock selection and reference clock generation circuit switches the clock selection at a fixed phase timing of the reference clock.

12. An apparatus according to claim 8, further comprising an active clock phase judging section for outputting a signal indicative of a failure of an active clock when a detected phase difference for the selected clock exceeds a tolerance range.

13. An apparatus according to claim 8, further comprising:

a standby clock phase holding section for holding the phase difference detected at the time of normal operation for the non-selected clock; and a standby clock phase verification section for outputting a signal indicative of a failure of a standby clock when, for the non-selected clock, a difference exceeding a tolerance range is detected between the detected phase difference and the phase difference being held.

14. An apparatus according to claim 13, further comprising a timer section for prohibiting switching of the clock selection until a prescribed time elapses after the difference between the detected phase difference and the phase difference being held has been brought back into the tolerance range from outside the tolerance range.

* * * * *